United States Patent
Yasuda (10) Patent No.: US 9,484,895 B2
(45) Date of Patent: Nov. 1, 2016

(54) SELF-ADJUSTING DUTY CYCLE TUNER

(71) Applicant: International Business Machines Corporation, Armonk, NY (US)

(72) Inventor: Takeo Yasuda, Nara (JP)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 14/094,628

(22) Filed: Dec. 2, 2013

(65) Prior Publication Data

US 2014/0084979 A1    Mar. 27, 2014

Related U.S. Application Data

(63) Continuation of application No. 13/544,588, filed on Jul. 9, 2012.

(51) Int. Cl.
     *H03K 3/017*      (2006.01)
     *H03K 5/00*      (2006.01)

(52) U.S. Cl.
     CPC ..... *H03K 3/017* (2013.01); *H03K 2005/00247* (2013.01)

(58) Field of Classification Search
     CPC ........ H03L 7/08; H03L 7/0999; H03M 7/43; H01S 3/133; H03K 5/04; H03K 5/14; H03K 3/017; H03K 5/13; H03K 19/0175; H03K 5/05; H03K 5/00; H03K 3/354; H01L 27/04; H01L 21/822; H01L 21/8234; H01L 27/088; H01L 27/108; H01L 21/8242; H01L 29/786; G11B 20/14; G06F 1/06; G06F 15/78; G11C 11/407
See application file for complete search history.

(56) References Cited

U.S. PATENT DOCUMENTS

| | | | |
|---|---|---|---|
| 6,084,452 A | 7/2000 | Drost et al. | |
| 6,992,515 B1 | 1/2006 | Birrittella | |
| 7,612,622 B2 * | 11/2009 | Margittai | H03K 3/0315 327/161 |
| 2009/0243734 A1 * | 10/2009 | Margittai | 331/57 |
| 2011/0074301 A1 * | 3/2011 | Goder | H05B 33/0818 315/210 |
| 2011/0090940 A1 * | 4/2011 | Wadhwa et al. | 375/219 |
| 2012/0256669 A1 * | 10/2012 | Ozgun et al. | 327/175 |
| 2013/0249614 A1 * | 9/2013 | Zhang et al. | 327/175 |

(Continued)

FOREIGN PATENT DOCUMENTS

| CN | 101278481 A | 10/2008 |
|---|---|---|
| CN | 101594129 A | 12/2009 |

(Continued)

*Primary Examiner* — Mischita Henson
*Assistant Examiner* — Christine Liao
(74) *Attorney, Agent, or Firm* — Thomas E. Tyson; Jack V. Musgrove (57) ABSTRACT

A duty cycle tuner measures high and low periods of a signal, calculates an actual duty cycle, generates duty control signals based on the actual duty cycle and a desired duty cycle, and adjusts the duty cycle responsive to the duty control signals. The high and low periods are measured using high-speed counters to provide a high count for the high period and a low count for the low period. The actual duty cycle value is then computed from the high and low counts, and compared to the desired duty cycle value to generate increment and decrement signals which may be positive or zero, to increase, decrease or maintain the actual duty cycle. In this manner, even if the high and low counts are subject to variations due to process, temperature or power supply voltage, their ratio is independent of such variations, so the tuner is immune to those effects.

5 Claims, 5 Drawing Sheets

(56) References Cited

U.S. PATENT DOCUMENTS

2013/0314137 A1* 11/2013 Chang .................... 327/175
2014/0333361 A1* 11/2014 Chau et al. ............. 327/175

FOREIGN PATENT DOCUMENTS

| JP | 57-152216 A | 9/1982 |
| JP | 1981-037083 A | 9/1982 |
| JP | 02-294113 A | 12/1990 |
| JP | 2833193 B | 6/1992 |
| JP | 05-191296 A | 7/1993 |
| JP | 3379209 B | 10/1995 |
| JP | 09-321590 A | 12/1997 |
| JP | 10-229166 A | 8/1998 |
| JP | 11-298080 A | 10/1999 |
| JP | 2003-023344 A | 1/2003 |
| JP | 2003-163584 A | 6/2003 |
| JP | 2004-242317 A | 8/2004 |
| JP | 2004-348573 A | 12/2004 |
| JP | 2007-006517 A | 1/2007 |
| JP | 2009-153084 A | 7/2009 |
| JP | 2010-158004 A | 7/2010 |
| JP | 2010-233180 A | 10/2010 |

* cited by examiner

SELF-ADJUSTING DUTY CYCLE TUNER

CROSS-REFERENCE TO RELATED APPLICATION

This application is a continuation of copending U.S. patent application Ser. No. 13/544,588 filed Jul. 9, 2012.

BACKGROUND OF THE INVENTION

1. Field of the Invention

The present invention generally relates to digital electronics, and more particularly to a method of controlling the duty cycle of a signal.

2. Description of the Related Art

In digital electronics, the duty cycle of a signal is defined as the ratio of the pulse duration (the time the signal is logical high state) to the period of the waveform. For example, a perfect square wave would have a duty cycle of 50%, that is, it is in a high state for exactly half of the signal period. The concept of a duty cycle applies only to periodic signals.

For many high performance circuit applications, the duty cycle of a signal must be carefully controlled. While duty cycle control is valuable in many applications including dynamic logic circuits, analog circuits, arrays, etc., it is particularly important for clock supply circuits. A wide variety of duty cycle controllers have been devised including programmable controllers which allow a user or program interface to set the duty cycle using a digital input value, e.g., from 0-10, wherein an input value of 0 results in a 0% duty cycle and an input value of 10 results in a 100% duty cycle.

SUMMARY OF THE INVENTION

The present invention is directed to tuning of the duty cycle of a target signal by measuring a high period of the target signal, measuring a low period of the target signal, calculating an actual duty cycle value of the target signal based on measurements of the high period and the low period, generating one or more duty control signals based on the actual duty cycle value and a desired duty cycle value, and automatically adjusting the duty cycle of the target signal using a duty cycle controller responsive to the duty control signals. In the illustrative embodiment, the duty control signals include an increment signal and a decrement signal, and the duty cycle controller increases the duty cycle of the target signal when the increment signal has a positive value, and decreases the duty cycle of the target signal when the decrement signal has a positive value. The high and low periods can be measured using high-speed counters to provide a high count for the high period and a low count for the low period. The actual duty cycle value for the target signal can then be calculated from the high and low counts in a way to not be affected by process, temperature or power supply variation even if the high and low counts are affected, and compared to the desired duty cycle value to generate the increment and decrement signals. In this manner, even if the high and low counts are subject to variations due to process, temperature or power supply voltage, their ratio is independent of such variations, so the tuner is immune to those effects.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

While various means have been devised to provide precision control of duty cycles for digital signal processing, inaccuracies can still be introduced by variations in process, temperature or power supply voltage. These variations can result in significant degradation of duty cycle control, leading to operational problems such as timing violations. It would, therefore, be desirable to devise an improved method of regulating the duty cycle which could overcome variation associated with uncontrollable sources such as process, temperature or power supply voltage. It would be further advantageous if the method could allow for self-adjustment of the duty cycle in real time.

The present invention achieves these benefits by measuring high and low periods of the target signal which are used to calculate an actual duty cycle and generate correction signals that allow for self-adjustment of the target signal's duty cycle. The length of these periods can be measured by counting the number of pulses of high speed generators in high and low periods of the target signal with a high speed counter. The invention thus tunes the duty cycle based on feedback for error compensation using currently measured values. As both high and low periods are measured in the same condition (the counting circuits are located at a common circuit area) and their ratio is used for the tuning, this tuning is free from the effects of variations in process, temperature or power supply voltage.

Figure 1:
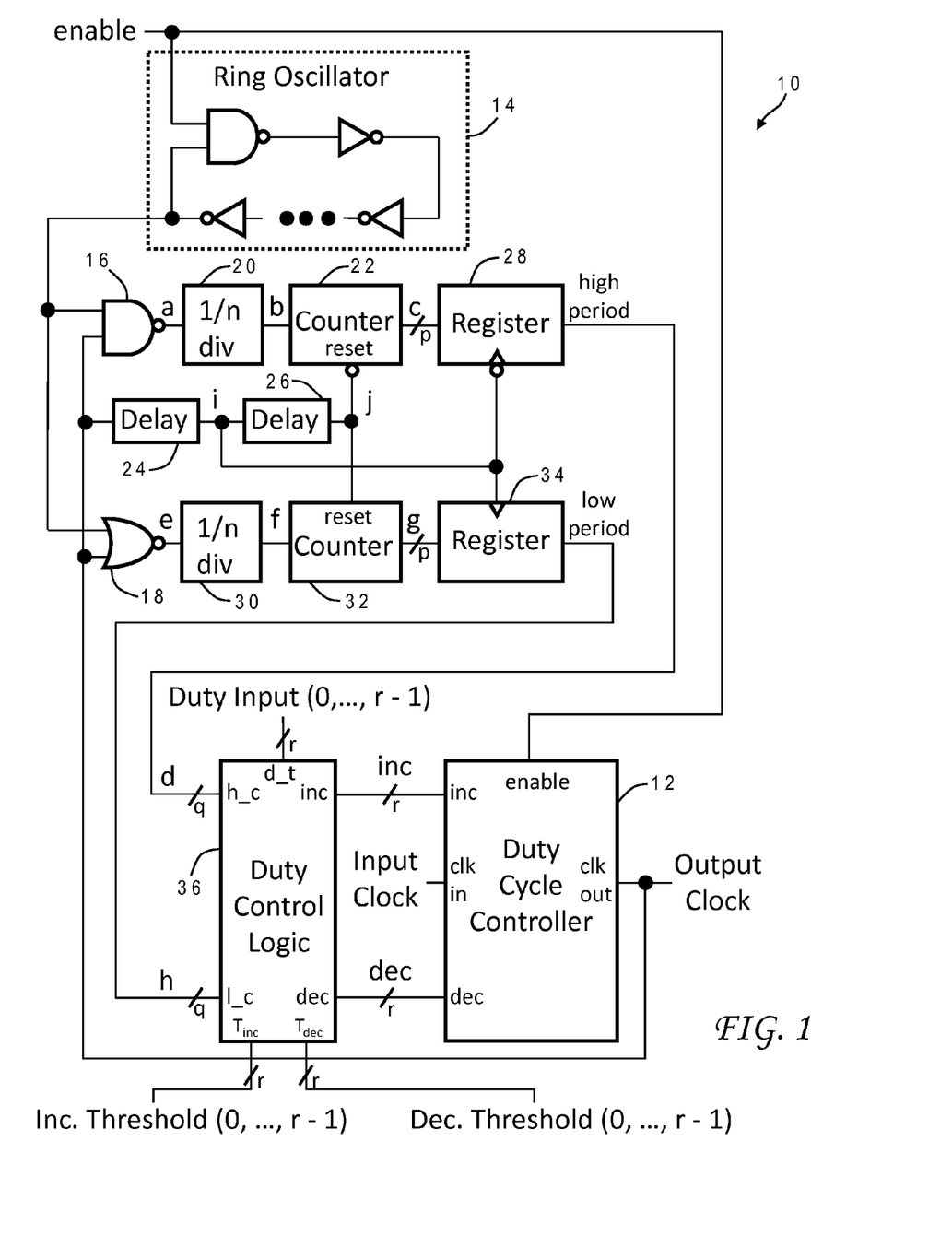
FIG. 1 is a high-level schematic diagram of one embodiment of a self-adjusting duty cycle tuner constructed in accordance with the present invention.

With reference now to the figures, and in particular with reference to FIG. 1, there is depicted one embodiment 10 of a self-adjusting duty cycle tuner constructed in accordance with the present invention. Self-adjusting duty cycle tuner 10 includes a duty cycle controller 12 which receives a digital input signal such as a clock signal having a current duty cycle, and generates an output signal with an adjusted duty cycle. Duty cycle controller 12 adjusts the duty cycle of the input clock signal based on two correction signals including an increment signal "inc" and a decrement signal "dec". These correction signals represent adjustment values based on measured high and low periods of the output clock signal.

The high and low periods of the target signal are measured using a high-speed counter which includes an input pulse generator 14 that produces high-speed pulses at a frequency greater than the frequency of the target signal. In the illustrative embodiment input pulse generator 14 is a ring oscillator having a NAND gate which receives two input signals, an enable signal and a feedback signal. The enable signal allows tuner 10 to be used in a selective (programmable) manner, i.e., it is operational only when the enable signal is on (logical high state). The enable signal can also be provided to duty cycle controller 12. The output of the ring oscillator's NAND gate is connected to an inverter chain which generates the feedback signal. This feedback signal (the output of the inverter chain) is also connected to input ports of two gates, a NAND gate 16 and a NOR gate 18. The other input port of each of gate 16, is connected to the output clock signal. The output signals of gates 16 and 18 thus represent high-speed pulses occurring during the high and low states, respectively, of the output clock signal. These two output signals are respectively connected to two dividers 20, 30 which divide the number of received pulses by some integer n, i.e., divider 20 generates an output pulse only after n high-period pulses have been received from NAND gate 16, and divider 30 generates an output pulse only after n low-period pulses have been received from NOR gate 18. The output signals of dividers 20, 30 are respectively connected to two counters 22, 32. Dividers 20, 30 provide for pre-scaling of the high speed pulse so that it can be handled in counters 22, 32.

Counters 22, 32 are set to zero by a reset signal from a first delayed clock signal (the reset signal is low level active in counter 22 while it is high level active in counter 32). The first delayed clock signal is generated by passing the output clock signal through two delay elements 24, 26. In this manner, the values stored in counters 22, 32 represent current high and low counts corresponding to the high and low periods of the output clock signal The output signals of counters 22, 32 (each p bits) are respectively connected to two registers 28, 34. Registers 28, 34 latch the data at nodes c and g, respectively, at the edge of the second delayed clock signal which is generated by passing the output clock signal through only delay element 24 (register 28 latches data at the falling edge of the second delayed clock while register 34 latches data at the rising edge of it), i.e., the first and second delayed clock signals are sequential delays, which allows registers 28, 34 to capture the high and low counts before counters 22, 32 are reset. The values stored in registers 28, 34 therefore represent quantitative measurements of the high and low periods of the just completed cycle of the output clock signal. NAND gate 16, divider 20, counter 22 and register 28 may accordingly be considered a first counting circuit, while NOR gate 18, divider 30, counter 32 and register 34 may be considered a second counting circuit. Those skilled in the art will appreciate that other counting circuits may be used to measure the high and low periods of the current clock cycle.

As the nominal frequency of input pulse generator 14 may vary considerably depending upon the variation of process, temperature and power supply voltage, the divide value "n" of dividers 20, 30 determines and adjusts the minimum granularity of the period in one pulse count. Input pulse generator 14 should provide pulses at a frequency that is sufficiently high to give the resolution required to implement duty cycle tuning. As an example and without limitation to applications of the present invention, for a clock signal having a frequency in the range of 15.6 MHz to 1 GHz, input pulse generator can have a frequency of 8 GHz to 32 GHz, dividers 20, 30 can divide by a factor of 1 to 4, and counters 22, 32 can have a maximum value of 256 (8 bits).

The output signals of registers 28, 34 (the high and low period counts) are provided to duty control logic 36 which calculates the increment and decrement signals (each r bits) used by duty cycle controller 12. As described in further detail below with regard to FIG. 2, duty control logic 36 will set the increment signal to zero and set the decrement signal to some positive value when the calculated duty cycle (h_c/(h_c+l_c)) value is greater than the desired duty cycle (duty input) value plus some decrement threshold value ($T_{dec}$), and will set the decrement signal to zero and set the increment signal to some positive value when the calculated duty cycle value is smaller than the desired duty cycle value minus some increment threshold value ($T_{inc}$). Duty control logic 36 will set both the increment signal and the decrement signal to zero when the calculated duty cycle value is within an operational range surrounding the desired duty cycle as defined by the increment and decrement threshold values ($\alpha$). FIG. 3 depicts the duty cycle tuning range 38 according to these control rules.

Duty cycle controller 12 is controlled by the increment and decrement signals from duty control logic 36. The clock duty cycle is increased when the increment signal has a positive (non-zero) value while it is decreased when the decrement signal has a positive (non-zero) value. Duty cycle controller 12 may be a conventional controller, for example, any of the duty cycle controllers disclosed in Japanese patent application publication nos. 09-321590, 2009-153084, 2010-158004, or 2010-233180.

The present invention may be further understood with reference to a simplified operational example for self-adjusting duty cycle tuner 10. In this example, the input clock signal is intended to have a 50% duty cycle, that is, the clock source has been either designed or programmed for a simple square wave. In order to have a duty cycle value of 50%, the duty input value is set to 0.5 (50%) in an r-bit expression. However, due to variations in the manufacturing process and the particular voltage supply which is powering tuner 10 and its temperature, the actual clock signal generated by the source has only a 45% duty cycle. In this case, and within one clock cycle after tuner 10 is activated by turning on the enable signal, the counting circuits will have calculated a low period count which is greater than the high period count for the output clock signal. In the subsequent clock cycle, duty control logic 36 will generate a positive value for the increment signal and a zero value for the decrement signal. Duty cycle controller 12 will receive these correction signals and will responsively increase the duty cycle according to the amount indicated from the increment signal. The same high and low clock period evaluation and duty cycle correction are applied in the following clock cycle if the duty cycle is not within target range 38. This process is repeated until the duty cycle is in the target range (50%±$\alpha$). Thereafter, according to this example, the ambient temperature for tuner 10 changes, causing an increase in the duty cycle of the input clock signal, which in turn leads to a duty cycle of 55% for the output clock signal. In this case, and again within one cycle after the fluctuation of the duty cycle occurs, the counting circuits will now calculate a high period count which is greater than the low period count for the output clock signal, so duty control logic 36 generates a positive value for the decrement signal and a zero value for the increment signal, and duty cycle controller 12 responsively decreases the duty cycle towards 50%. This process is repeated until duty cycle is in the target range (50%±α) in the same way as above. Those skilled in the art will appreciate that the 50% duty cycle value is just an example, and the tuner may be used to regulate a signal having any duty cycle value.

Figure 2:
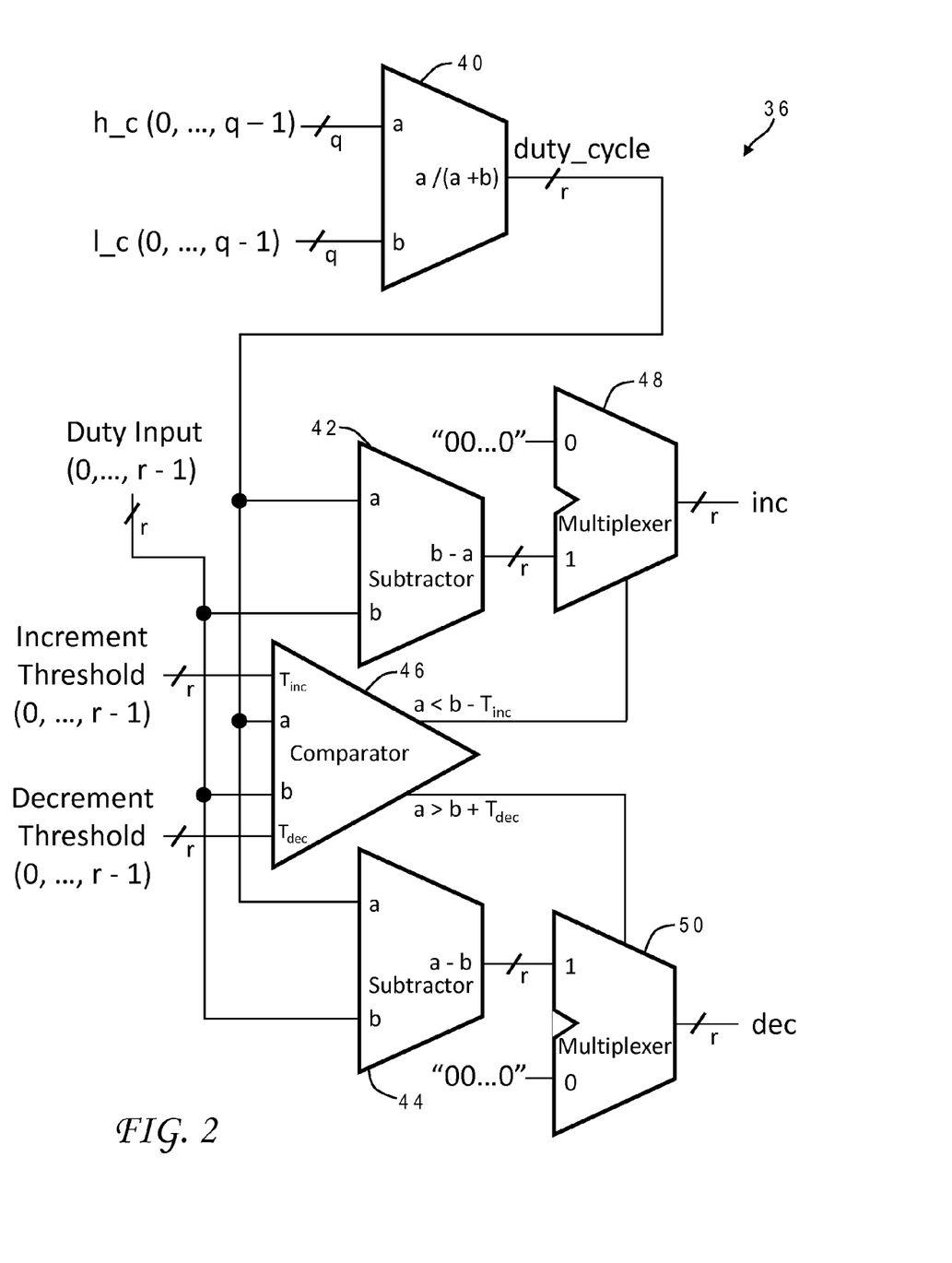
FIG. 2 is a high-level schematic diagram of one embodiment of a duty control logic circuit constructed in accordance with the present invention which may be used in the duty cycle tuner of FIG. 1.
Figure 3:
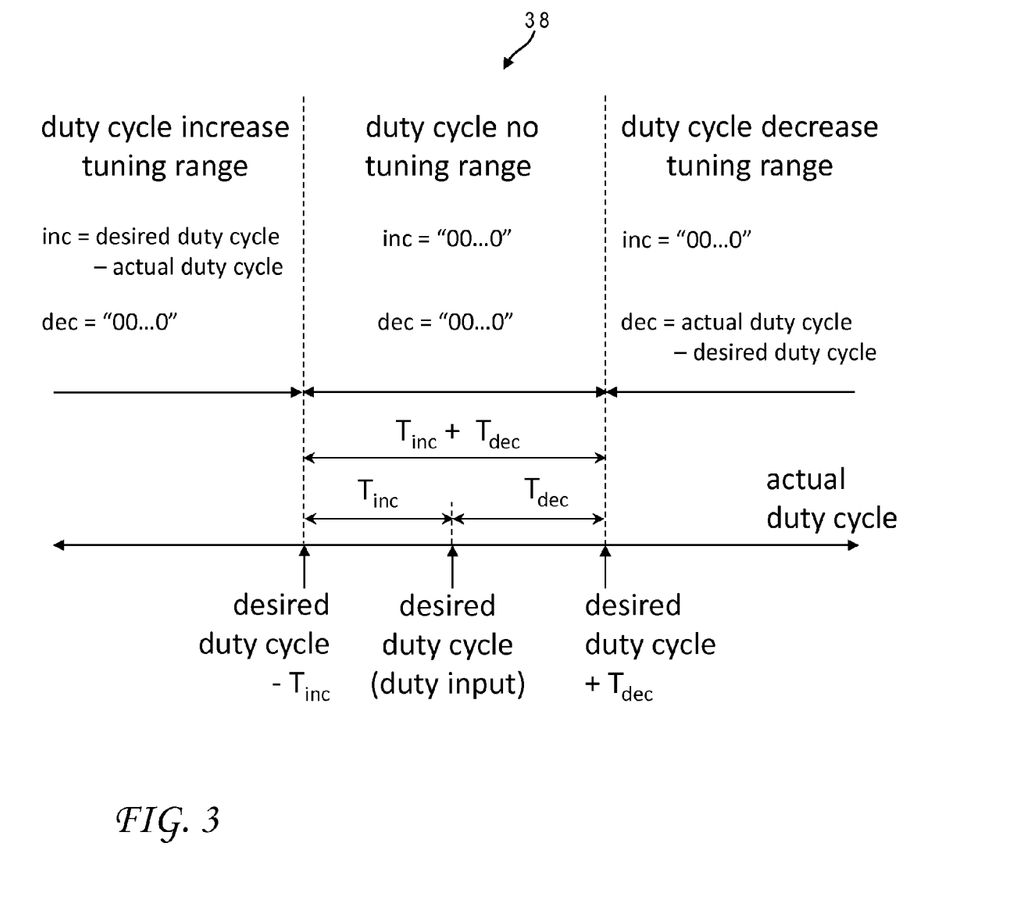
FIG. 3 is a chart showing a duty cycle tuning range which can be implemented in the duty control logic of FIG. 1 and FIG. 2 in accordance with one embodiment of the present invention.

With reference now to FIG. 2, the detailed structure for one embodiment of duty control logic 36 in accordance with the present invention is depicted. Duty control logic 36 receives the high count signal (h_c), the low count signal (l_c) (each q bits), and a duty input signal (r bits). The h_c and l_c signals are used to calculate the effective duty cycle (r bits) in the "a/(a+b)" arithmetic operation unit 40. Arithmetic operation unit 40 can calculate the effective duty cycle based on the ratio of the low and high counts, since a/(a+b)=1/(1+b/a). The output of duty cycle arithmetic operation unit 40 is used as one input of two subtractors 42, 44 and a comparator 46. The other input to subtractors 42, 44 and comparator 46 is the duty input signal (r bits) which indicates the desired duty cycle value for the given application. The desired duty cycle is determined externally, and its value can be set in various ways including manually, programmably, or by blowing fuses in the integrated circuit design. Comparator 46 has $T_{inc}$ and $T_{dec}$ input ports which are the amount of threshold for increase control and decrease control, respectively. The increment threshold and decrement threshold signals (both r bits) which are connected to the $T_{inc}$ and $T_{dec}$ ports are determined externally in the same manner as the duty input (desired duty cycle). These values are set to avoid duty cycle continuous tuning when the actual duty cycle value is almost at the desired values. This corresponds to the ±α duty cycle tolerance, that is, duty cycle no tuning range shown as 38 in FIG. 3.

The outputs of comparator 46 are accordingly an indication of whether the actual duty cycle is smaller than the desired duty clock cycle minus $T_{inc}$, or is greater than the desired duty cycle plus $T_{dec}$. If the actual duty cycle is smaller than the desired duty cycle minus $T_{inc}$, comparator 46 activates the upper output signal to a first multiplexer 48. Multiplexer 48 receives a zero value ("00 . . . 0") input signal (r bits) and an input signal from the output of subtractor 42 (the amount by which the desired duty cycle exceeds the actual duty cycle, in r bits). The latter input signal is passed to the "inc" output signal as the increment signal when the upper output signal from comparator 46 is active. If the actual duty cycle is equal to or greater than the desired duty cycle minus $T_{inc}$, the upper output signal from comparator 46 to multiplexer 48 remains off, yielding a "00 . . . 0" (r bits) output for the increment signal. If the actual duty cycle is greater than the desired duty cycle plus $T_{dec}$, comparator 46 activates the lower output signal to a second multiplexer 50. Multiplexer 50 receives a zero value ("00 . . . 0") input signal (r bits) and an input signal from the output of subtractor 44 (the amount by which the actual duty cycle exceeds the desired duty cycle, in r bits). The latter input signal is passed to the "dec" output signal as the decrement signal when the lower output signal from comparator 46 is active. If the actual duty cycle is equal to or smaller than the desired duty cycle plus $T_{dec}$, the output signal from comparator 46 to multiplexer 50 remains off, yielding a "00 . . . 0" (r bits) output for the decrement signal. The increment and decrement signals are then used by duty cycle controller to automatically adjust the duty cycle of the input clock signal. As an example and again without limitation to applications of the present invention, in the illustrative implementation duty control logic 36 receives 8-bit (q) count input signals (the h_c and l_c signals) and a 9-bit (r) duty input signal, and generates 9-bit (r) output signals (the increment and decrement signals).

The frequency of ring oscillator 14 may fluctuate depending on variations in process, temperature or power supply voltage, so the number of pulses generated by dividers 20, 30 may also be inconsistent over time. However, the ratio of the pulse counts which is calculated as "duty_cycle" in duty control logic 36 is independent of such variations, so the tuning achieved by duty cycle controller 12 is free from variations due to process, temperature or power supply voltage, and this duty cycle tuning shows quick response since it performs real-time feedback.

Figure 4:
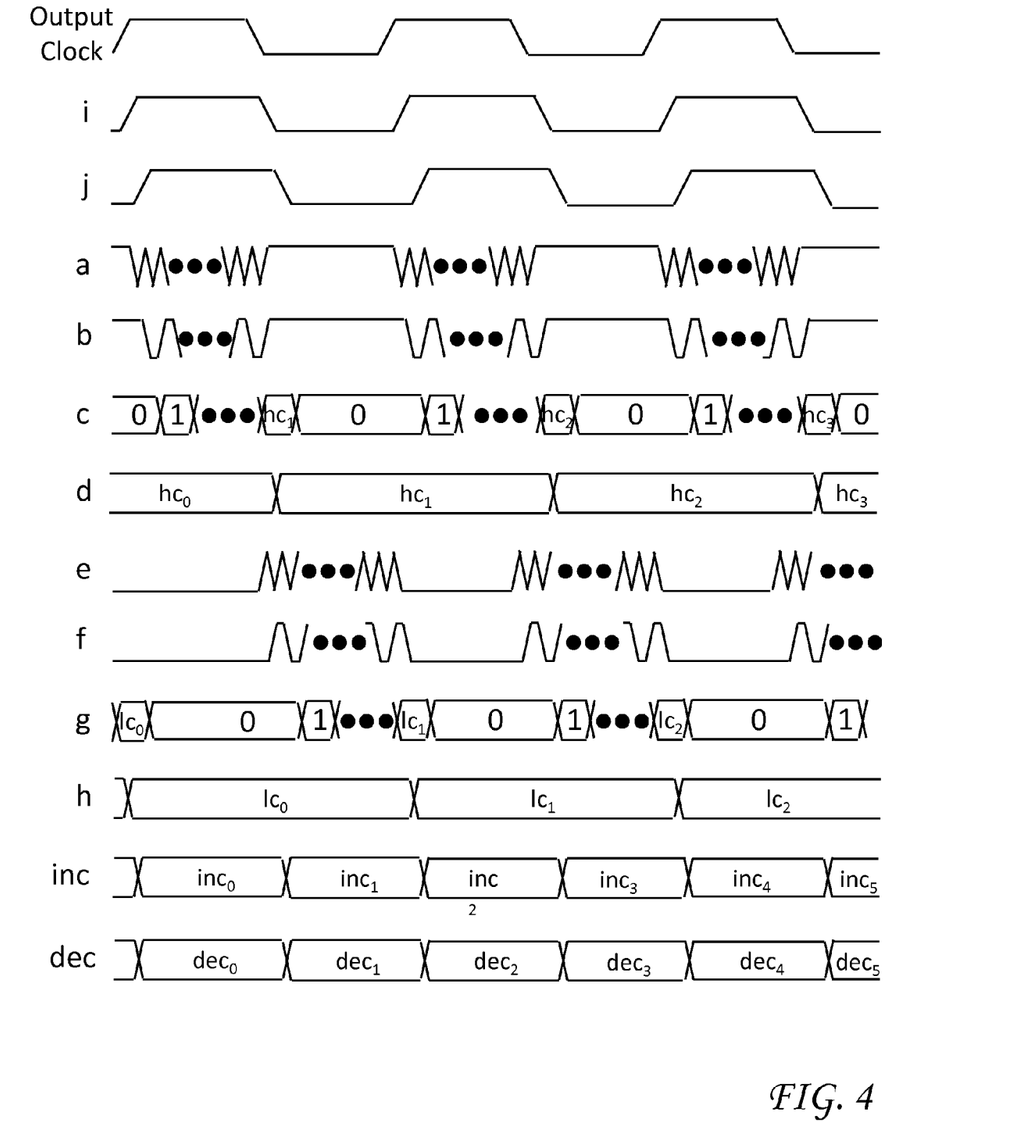
FIG. 4 is a timing diagram illustrating various signals and count values in one implementation of the present invention for the different nodes, counters and registers of the duty cycle tuner of FIG. 1.

FIG. 4 is a timing diagram showing the signals for an illustrative implementation of tuner 10 at various nodes labeled in FIG. 1 as a-j. The output clock signal is at the top of the diagram, followed by the two delayed clock signals at nodes i and j (the clock input signals to the registers and counters, respectively). When the output clock signal is high, NAND gate 16 is pulsing its output as indicated for node a, and the divided pulse is being sent to counter 22 through node b. The count value at node c continues incrementing while the output clock remains high level, but during this time the high count signal at node d is keeping the value in the previous cycle ($hc_0$) since register 28 has not been latched yet. When the delay signal at node i switches to low level, the current high period count value ($hc_1$) is loaded into register 28, i.e., is output at node d. Shortly thereafter, the delay signal at node j switches to low level, resetting counter 22 at node c. This cycle repeats each time the output clock signal is high, to yield successive high count values ($h_i$: i=2, 3, . . . ).

When the output clock is signal is low, NOR gate 18 is pulsing its output as indicated for node e, and the divided pulse is being sent to counter 32 through node f. The count value at node g continues incrementing while the output clock remains low level, but during this time the low count signal at node h is keeping the value in the previous cycle ($lc_0$) since register 34 has not been latched yet. When the delay signal at node i switches to high level, the current low period count value ($lc_1$) is loaded into register 34, i.e., is output at node h. Shortly thereafter, the delay signal at node j switches to high level, resetting counter 32 at node g. This cycle repeats each time the output clock signal is low, to yield successive low count values ($l_i$: i=2, 3, . . . ). The increment and decrement signals are generated in duty control logic 36 every time the high and low count signals (at node d and node h) are updated, i.e., on the rising and falling edges of the delayed clock signal at node i. For systems which require lower accuracy of duty cycle tuning, the period for duty cycle tuning can be reduced by setting larger values for $T_{inc}$ and $T_{dec}$. The numbers of this feedback control can be reduced if less frequent feedback is favorable.

Figure 5:
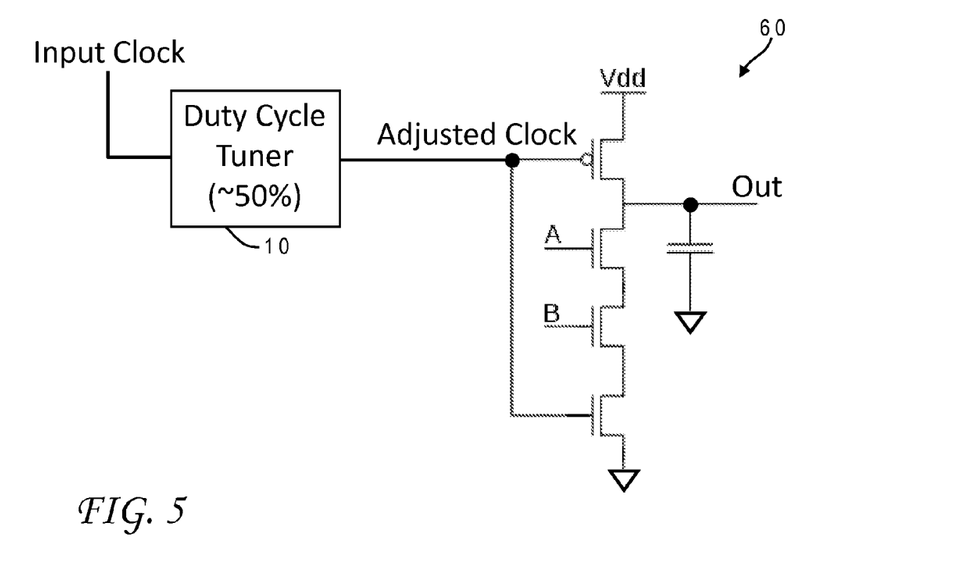
FIG. 5 is a high-level schematic diagram depicting one application of the self-adjusting duty cycle tuner of the present invention in a dynamic logic circuit.

The present invention has application to any electronic system requiring duty cycle regulation of a signal. FIG. 5 illustrates one of many possible examples where tuner 10 is particularly advantageous. A dynamic circuit 60 has two input signals A and B. When the clock input to dynamic circuit 60 is in a low state, the circuit is in a precharge phase at which the output capacitor will be charged regardless of the values of A and B and their combinational logic. When the clock input signal is in a high state, the circuit is in an evaluation phase at which the output value is dependent upon the values of input A and input B. For this application the input signals A, B must be set at a low logic level before the clock signal becomes high. Furthermore, the output must be captured before the clock signal becomes low. It is therefore critical that the duty cycle of the clock be accurate to ensure proper circuit performance. So if the circuit requires a pre-charge period larger than the evaluation period, its duty cycle can be set to an appropriate value of less than 50%. If it requires an evaluation period longer than pre-charge period, the duty cycle can be set to an appropriate value of more than 50%. Use of tuner 10 to provide an adjusted clock signal guarantees that the duty cycle will be unaffected by variations in process, temperature or power supply voltage. In the example of FIG. 5, dynamic circuit 60 is a NAND gate but those skilled in the art understand that the clocking principles apply to other dynamic circuits as well.

Other notable applications include an array circuit, a level sensitive latch, a sample and hold circuit, and a switched capacitor integrator. For an array circuit such as a memory array using wordline drivers, the width of the wordline signals (read and write lines) affects array read and write performance. The width of the wordline signals is dictated by the active (high or low) period of the clock signal, and thus should be carefully controlled. In a level sensitive latch (or D-latch), data is transparent from the D input to the Q output at the high (or low) level of the clock signal, and data is latched at the low (or high) level of the clock signal. It is accordingly important to set the high (or low) period of the clock signal which corresponds to the transparent period of the level sensitive latch as long as possible. However the transparent period should be short enough to avoid causing a hold violation (racing). Thus accurate duty cycle tuning is required for performance optimization. For a sample and hold circuit, data is sampled at the high level of the clock signal, and held at the low level of the clock signal. The duty cycle of the clock signal thus determines the ratio of sample and hold periods, which needs to be accurately controlled to maintain an appropriate resistor-capacitor (RC) constant for the circuit. In a switched capacitor integrator, charge is transferred from the data input to the data output through transfer-gate switches. To implement the ideal performance with this integrator, the duty cycle of the clock signal should be controlled as closely as possible to 50%. These applications should not be construed in a limiting sense as many other circuits may be targeted for duty cycle control.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, duty control logic 36 is described as providing the two different increment and decrement signals to duty cycle controller 12, but in an alternative implementation duty control logic 36 can encode the duty control data into a single signal (r bits) which can then be decoded by the duty cycle controller into separate increment and decrement signals. It is therefore contemplated that such modifications can be made without departing from the spirit or scope of the present invention as defined in the appended claims.

What is claimed is:

1. A method of tuning the duty cycle of a target signal comprising:
    measuring a high period of the target signal by counting a number of first high-speed pulses occurring during a high state of the target signal to derive a high count, wherein the first high-speed pulses are produced using an input pulse generator and a NAND gate having two input ports which receive input pulses from the input pulse generator and the target signal;
    measuring a low period of the target signal by counting a number of second high-speed pulses occurring during a low state of the target signal to derive a low count, wherein the second high-speed pulses are produced using the input pulse generator and a NOR gate having two input ports which receive input pulses from the input pulse generator and the target signal;
    calculating an actual duty cycle value of the target signal based on measurements of the high period and the low period;
    generating one or more duty control signals based on the actual duty cycle value and a desired duty cycle value; and
    automatically adjusting the duty cycle of the target signal using a duty cycle controller responsive to the one or more duty control signals.

2. The method of claim 1 wherein:
    the one or more duty control signals include an increment signal and a decrement signal; and
    the duty cycle controller increases the duty cycle of the target signal when the increment signal has a positive value, decreases the duty cycle of the target signal when the decrement signal has a positive value, and does not change the duty cycle of the target signal when both the increment and decrement signals are set to zero.

3. The method of claim 1 wherein:
    the high and low counts are derived using counters located at a common circuit area with essentially identical operating conditions such that both the high count and the low count have the same variation factors associated with process, temperature and power supply voltage; and
    said calculating the actual duty cycle value includes add and divide operations using the high and low counts, including a ratio of the high and low counts which cancels out the variation factors such that the actual duty cycle value is independent of variations in process, temperature and power supply voltage.

4. The method of claim 1 wherein
    the one or more duty control signals include an increment signal and a decrement signal;
    the increment signal is set to zero and the decrement signal is set to a positive value when the actual duty cycle value is greater than the desired duty cycle value plus a decrement threshold value;
    the decrement signal is set to zero and the increment signal is set to a positive value when the actual duty cycle value is smaller than the desired duty cycle value minus an increment threshold value; and
    both the increment signal and the decrement signal are set to zero when the actual duty cycle value is equal to or greater than the desired duty cycle value minus the increment threshold value and the actual duty cycle value is equal to or smaller than the desired duty cycle value plus the decrement threshold value.

5. The method of claim 4 wherein the positive value to which the increment signal or decrement signal is set is an absolute value of the difference between the actual duty cycle value and the desired duty cycle value.

* * * * *